United States Patent
Park et al.

(10) Patent No.: US 11,690,179 B2
(45) Date of Patent: Jun. 27, 2023

(54) SUBSTRATE CONNECTION MEMBER COMPRISING SUBSTRATE HAVING OPENING PART, WHICH ENCOMPASSES REGION IN WHICH THROUGH WIRE IS FORMED, AND CONDUCTIVE MEMBER FORMED ON SIDE SURFACE OF OPENING PART, AND ELECTRONIC DEVICE COMPRISING SAME

(71) Applicant: Samsung Electronics Co., Ltd., Gyeonggi-do (KR)

(72) Inventors: Sungchul Park, Gyeonggi-do (KR); Sangwon Ha, Gyeonggi-do (KR); Chulwoo Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/286,519

(22) PCT Filed: Oct. 18, 2019

(86) PCT No.: PCT/KR2019/013724
§ 371 (c)(1),
(2) Date: Apr. 19, 2021

(87) PCT Pub. No.: WO2020/085719
PCT Pub. Date: Apr. 30, 2020

(65) Prior Publication Data
US 2021/0360796 A1    Nov. 18, 2021

(30) Foreign Application Priority Data
Oct. 26, 2018 (KR) ........................ 10-2018-0129026

(51) Int. Cl.
*H05K 3/40* (2006.01)
*H05K 1/11* (2006.01)

(52) U.S. Cl.
CPC .......... *H05K 3/4046* (2013.01); *H05K 1/115* (2013.01); *H05K 2201/096* (2013.01)

(58) Field of Classification Search
CPC . H05K 1/03; H05K 1/16; H05K 1/115; H05K 1/144; H05K 1/0222; H05K 1/0237;
(Continued)

(56) References Cited

U.S. PATENT DOCUMENTS 5,381,306 A * 1/1995 Schumacher .......... H05K 1/115
29/850
7,408,120 B2 * 8/2008 Kim ....................... H05K 1/115
174/262

(Continued)

FOREIGN PATENT DOCUMENTS

CN    1417856 A    5/2003
CN    101499451 A    8/2009
(Continued)

OTHER PUBLICATIONS

CN-106325379-A Translation (Year: 2021).*
(Continued)

*Primary Examiner* — Hoa C Nguyen
*Assistant Examiner* — John B Freal
(74) *Attorney, Agent, or Firm* — Cha & Reiter, LLC

(57) ABSTRACT

A substrate connection member according to various embodiments of the present invention can comprise a printed circuit board which has a plurality of layers that are stacked and which comprises a front surface, a rear surface, and a side surface encompassing the front surface and the rear surface. The printed circuit board can comprise: an opening part which encompasses a partial region of the printed circuit board and which is penetratingly formed from the front surface to the rear surface; at least one bridge connected between the partial region and the printed circuit (Continued)

board by crossing at least a portion of the opening part; and at least one through-hole wire formed in the partial region from the front surface to the rear surface, wherein the inner surface of the opening part and the side surface of the bridge can be formed from a conductive member. Other various embodiments, in addition to the embodiments disclosed in the present invention, are possible.

15 Claims, 11 Drawing Sheets

(58) Field of Classification Search
CPC .... H05K 1/113; H05K 1/0204; H05K 1/0206; H05K 1/0221; H05K 1/0231; H05K 1/024; H05K 2201/096; H05K 2201/042; H05K 2201/09063; H05K 2201/09072; H05K 2201/09481; H05K 2201/09636; H05K 2201/09809; H05K 2201/10098; H05K 2201/10378; H05K 2201/10128; H05K 2201/09645; H05K 2201/0183; H05K 2201/01; H04M 1/0277; H04M 1/0249; H04B 1/40; H01L 21/76802; H01L 21/486

See application file for complete search history.

(56) References Cited

U.S. PATENT DOCUMENTS

| | | | | |
|---|---|---|---|---|
| 8,604,357 | B2* | 12/2013 | Takeda | H05K 3/429 |
| | | | | 174/266 |
| 2002/0148640 | A1* | 10/2002 | Holl | H01P 11/003 |
| | | | | 174/258 |
| 2003/0085471 | A1 | 5/2003 | Iijima et al. | |
| 2005/0098348 | A1* | 5/2005 | Okumichi | H01L 23/66 |
| | | | | 174/262 |
| 2007/0125570 | A1 | 6/2007 | Ho | |
| 2008/0117606 | A1 | 5/2008 | Karlsson | |
| 2008/0142258 | A1* | 6/2008 | Caletka | H05K 1/0219 |
| | | | | 174/264 |
| 2009/0102500 | A1 | 4/2009 | An et al. | |
| 2009/0189271 | A1 | 7/2009 | Hur et al. | |
| 2011/0019372 | A1* | 1/2011 | Teck Kheng | H01L 23/49827 |
| | | | | 361/760 |
| 2011/0075384 | A1 | 3/2011 | Yeates | |
| 2013/0052338 | A1 | 2/2013 | Hall et al. | |
| 2013/0104394 | A1* | 5/2013 | Hardin | H05K 1/0231 |
| | | | | 29/832 |
| 2013/0105987 | A1 | 5/2013 | Gallegos et al. | |
| 2013/0258624 | A1 | 10/2013 | Hardin | |
| 2017/0006715 | A1* | 1/2017 | Choi | H04M 1/0266 |
| 2017/0256492 | A1 | 9/2017 | Uzoh et al. | |
| 2017/0332484 | A1 | 11/2017 | Shangguan et al. | |

FOREIGN PATENT DOCUMENTS

| | | | | |
|---|---|---|---|---|
| CN | 101536618 A | | 9/2009 | |
| CN | 202178922 U | | 3/2012 | |
| CN | 103828492 A | | 5/2014 | |
| CN | 104206029 A | | 12/2014 | |
| CN | 205336651 U | | 6/2016 | |
| CN | 106325379 A | * | 1/2017 | .......... G06F 1/1656 |
| CN | 108538811 A | | 9/2018 | |
| JP | 2001053397 A | * | 2/2001 | |
| JP | 2017195298 A | | 10/2017 | |
| KR | 10-2009-0039341 A | | 4/2009 | |
| KR | 10-2012-0006620 A | | 1/2012 | |
| KR | 10-1126548 B1 | | 3/2012 | |
| KR | 10-2014-0058640 A | | 5/2014 | |

OTHER PUBLICATIONS

JP-2001053397-A Translation (Year: 2021).*
European Search Report dated Nov. 3, 2021.
Korean Office Action dated Sep. 12, 2022.
Chinese Office Action dated Nov. 29, 2022.
Korean Office Action dated Mar. 28, 2023.

* cited by examiner (a)

(b)

(a)

(b)

[b]

[a]

SUBSTRATE CONNECTION MEMBER COMPRISING SUBSTRATE HAVING OPENING PART, WHICH ENCOMPASSES REGION IN WHICH THROUGH WIRE IS FORMED, AND CONDUCTIVE MEMBER FORMED ON SIDE SURFACE OF OPENING PART, AND ELECTRONIC DEVICE COMPRISING SAME

CROSS REFERENCE TO RELATED APPLICATIONS

This application is a National Phase Entry of PCT International Application No. PCT/KR2019/013724, which was filed on Oct. 18, 2019, and claims a priority to Korean Patent Application No. 10-2018-0129026, which was filed on Oct. 26, 2018, the contents of which are incorporated herein by reference.

TECHNICAL FIELD

Various embodiments of the disclosure relate to a substrate connection member including a substrate having an opening part encompassing a region in which a through-wire is formed and a conductive member formed on a side surface of the opening part, and an electronic device including same.

BACKGROUND ART

With technological development, an electronic device such as a portable terminal has a smaller size and more functions. Even through the size of the electronic device gets smaller, various components are required to be mounted therein. To this end, the electronic device may include a printed circuit board (e.g., a printed circuit board (PCB), a printed board assembly (PBA), or a flexible printed circuit board (FPCB), etc.) for mounting various components thereon.

The printed circuit board may include a processor, a memory, a camera, a broadcast reception module, or a communication module required by an electronic device (e.g., a portable terminal or a smartphone). The printed circuit board may include a circuit wire for electrically connecting mounted multiple electronic components.

DISCLOSURE OF INVENTION

Technical Problem

One or more printed circuit boards mounted on an electronic device may include multiple components and may be stacked and mounted on the electronic device. Components included in the stacked printed circuit boards may be electrically connected to each other, wherein the components may be connected to each other through a transmission wire.

The strength of a signal transmitted through the transmission wire may be reduced due to the structure and the type of the transmission wire and another nearby element (e.g., an electronic component) disposed corresponding to the transmission wire. As the size of the electronic device gets smaller, multiple components are densely arranged, and the strength of a signal transmitted through the transmission wire must be reduced due to the interference between the densely arranged components.

An electronic device according to various embodiments of the disclosure may implement an interposer (e.g., a substrate connection member) in a structure having printed circuit boards stacked on each other and may include a through-wire formed inside an opening part of the implemented interposer. In transmitting a signal, various embodiments of the disclosure may provide an electronic device including a through-wire formed in an opening part of an interposer so as to prevent reduction of the strength of the signal and signal interference.

Solution to Problem

A substrate connection member according to various embodiments of the disclosure may include a printed circuit board which has multiple layers stacked on each other and includes a front surface, a rear surface, and a side surface encompassing the front surface and the rear surface. The printed circuit board may include: an opening part which encompasses a partial region of the printed circuit board and extends through from the front surface to the rear surface; at least one bridge connected between the partial region and the printed circuit board and across at least a part of the opening part; and at least one through-wire formed in the partial region from the front surface to the rear surface, wherein an inner surface of the opening part and a side surface of the bridge are formed of a conductive member.

An electronic device according to various embodiments of the disclosure may include: a communication circuit; and a printed circuit board having multiple layers stacked on each other and including a front surface, a rear surface, and a side surface encompassing the front surface and the rear surface. The printed circuit board may include: an opening part which encompasses a partial region of the printed circuit board and extends through from the front surface to the rear surface; at least one bridge connected between to the partial region and the printed circuit board and across at least a part of the opening part; and at least one through-wire which is electrically connected to the communication circuit and is formed in the partial region from the front surface to the rear surface, wherein an inner surface of the opening part and a side surface of the bridge are formed of a conductive member.

An electronic device according to various embodiments of the disclosure may include: a first circuit board on which a first communication circuit is disposed; a second circuit board on which a second communication circuit is disposed; and a substrate connection member which has multiple layers stacked on each other and includes a front surface, a rear surface, and a side surface encompassing the front surface and the rear surface. The substrate connection member may include: an opening part which encompasses a partial region of the substrate connection member and extends through from the front surface to the rear surface; at least one bridge connected to the partial region and the substrate connection member and across at least a part of the opening part; and at least one through-wire formed in the partial region from the front surface to the rear surface. In the substrate connection member, an inner surface of the opening part and a side surface of the bridge are formed of a conductive member, and in a state in which the first circuit board corresponding to the front surface faces the second circuit board corresponding to the rear surface, the first communication circuit and the second communication circuit are electrically connected to each other through the through-wire.

Advantageous Effects of Invention

An electronic device according to various embodiments of the disclosure may include one or more printed circuit boards stacked on each other, and the one or more printed circuit boards may include at least one opening part extending through from a front surface and a rear surface. According to various embodiments of the disclosure, a through-wire may be formed corresponding to the opening part, and when a signal is transmitted through the through-wire, reduction of the strength of the signal and signal interference can be minimized. Various embodiments of the disclosure can improve efficiency of signal transmission inside an electronic device.

MODE FOR THE INVENTION

Figure 1:
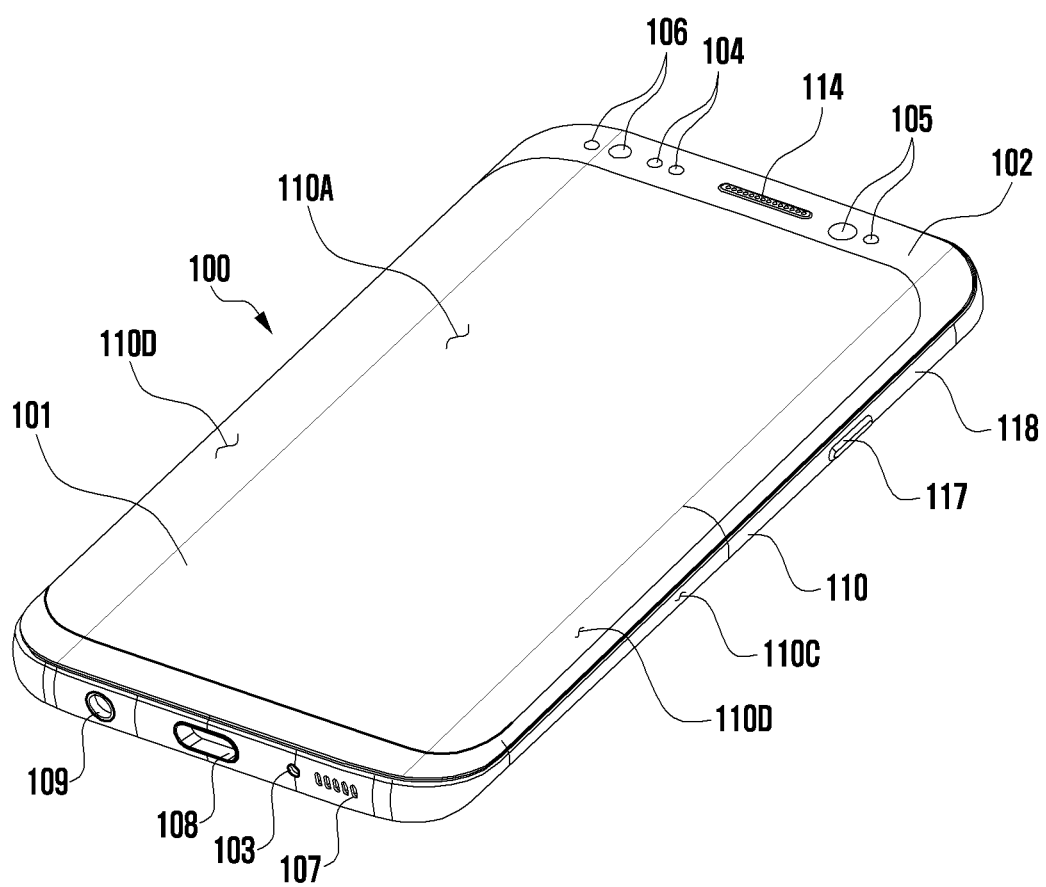
FIG. 1 is a perspective view of the front surface of a mobile electronic device according to an embodiment.
Figure 2:
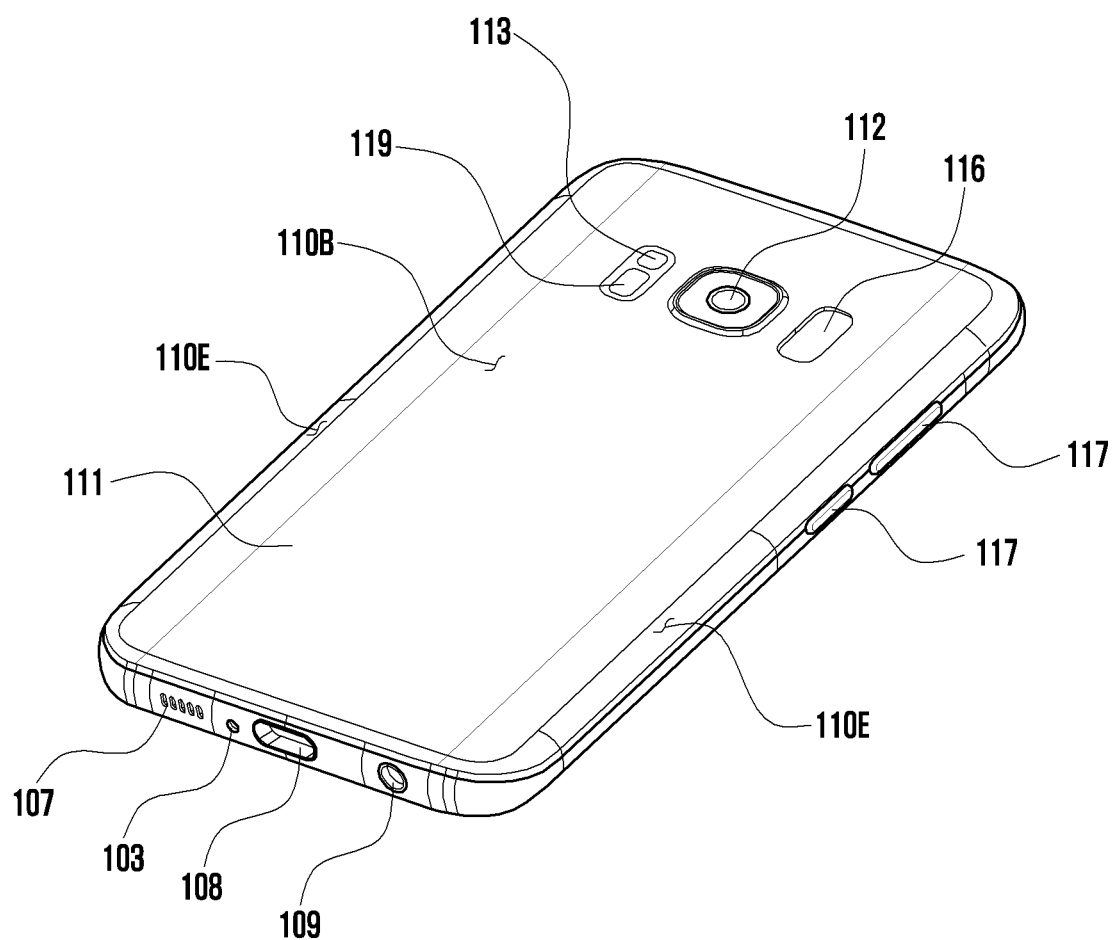
FIG. 2 is a perspective view of the rear surface of the electronic device of FIG. 1.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In some embodiments, the front plate 102 (or the rear plate 111) may include only one of the first areas 110D (or the second areas 110E). In another embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the constituent elements (for example, the key input device 117 or the light-emitting element 106) of the electronic device 100 may be omitted, or the electronic device 100 may additionally include another constituent element.

The display 101 may be exposed through a corresponding part of the front plate 102, for example. In some embodiments, at least a part of the display 101 may be exposed through the front plate 102 that forms the first areas 110D of the side surface 110C and the first surface 110A. In some embodiments, the display 101 may have a corner formed in substantially the same shape as that of the adjacent outer periphery of the front plate 102. In another embodiment (not illustrated), in order to increase the area of exposure of the display 101, the interval between the outer periphery of the display 101 and the outer periphery of the front plate 102 may be formed to be substantially identical.

In another embodiment (not illustrated), a recess or an opening may be formed in a part of the screen display area of the display 101, and at least one of an audio module 114, a sensor module 104, a camera module 105, and a light-emitting element 106 may be included and aligned with the recess or the opening. In another embodiment (not illustrated), on the back surface of the screen display area of the display 101, at least one of an audio module 114, a sensor module 104, a camera module 105, a fingerprint sensor 116 (for example, biometric sensor), and a light-emitting element 106 may be included. In another embodiment (not illustrated), the display 101 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, an HRM sensor) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In some embodiments, two or more lenses (an infrared camera, a wide-angle lens, and a telephoto lens) and image sensors may be arranged on a single surface of the electronic device 100.

The key input device 117 may be arranged on the side surface 110C of the housing 110. In another embodiment, the electronic device 100 may not include a part of the above-mentioned key input device 117 or the entire key input device 117, and the key input device 117 (not included) may be implemented in another type, such as a soft key, on the display 101. In some embodiments, the key input device may include a sensor module 116 arranged on the second surface 110B of the housing 110.

The light-emitting element 106 may be arranged on the first surface 110A of the housing 110, for example. The light-emitting element 106 may provide information regarding the condition of the electronic device 100 in a light type, for example. In another embodiment, the light-emitting element 106 may provide a light source that interworks with operation of the camera module 105, for example. The light-emitting element 106 may include, for example, an LED, an IR LED, and a xenon lamp.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
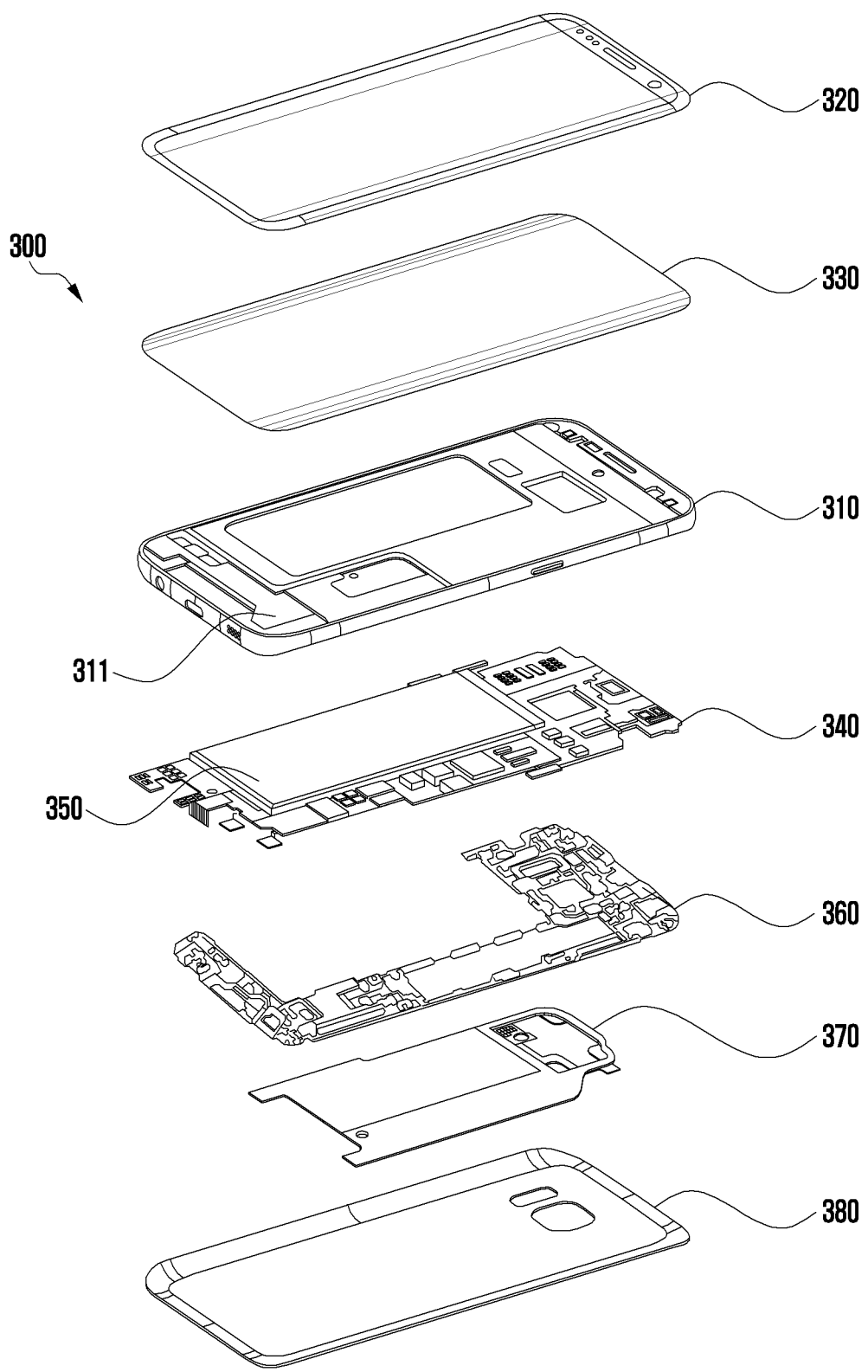
FIG. 3 is a developed perspective view of the electronic device of FIG. 1.

Referring to FIG. 3, the electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, an sensor hub processor, or a communication processor.

The memory may include a volatile memory or a non-volatile memory, for example. The various data may include, for example, software (e.g., the program) and input data or output data for a command related thereto. The memory may include the volatile memory (e.g., DRAM, SRAM, or SDRAM) or the non-volatile memory.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is a device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

Figure 4A:
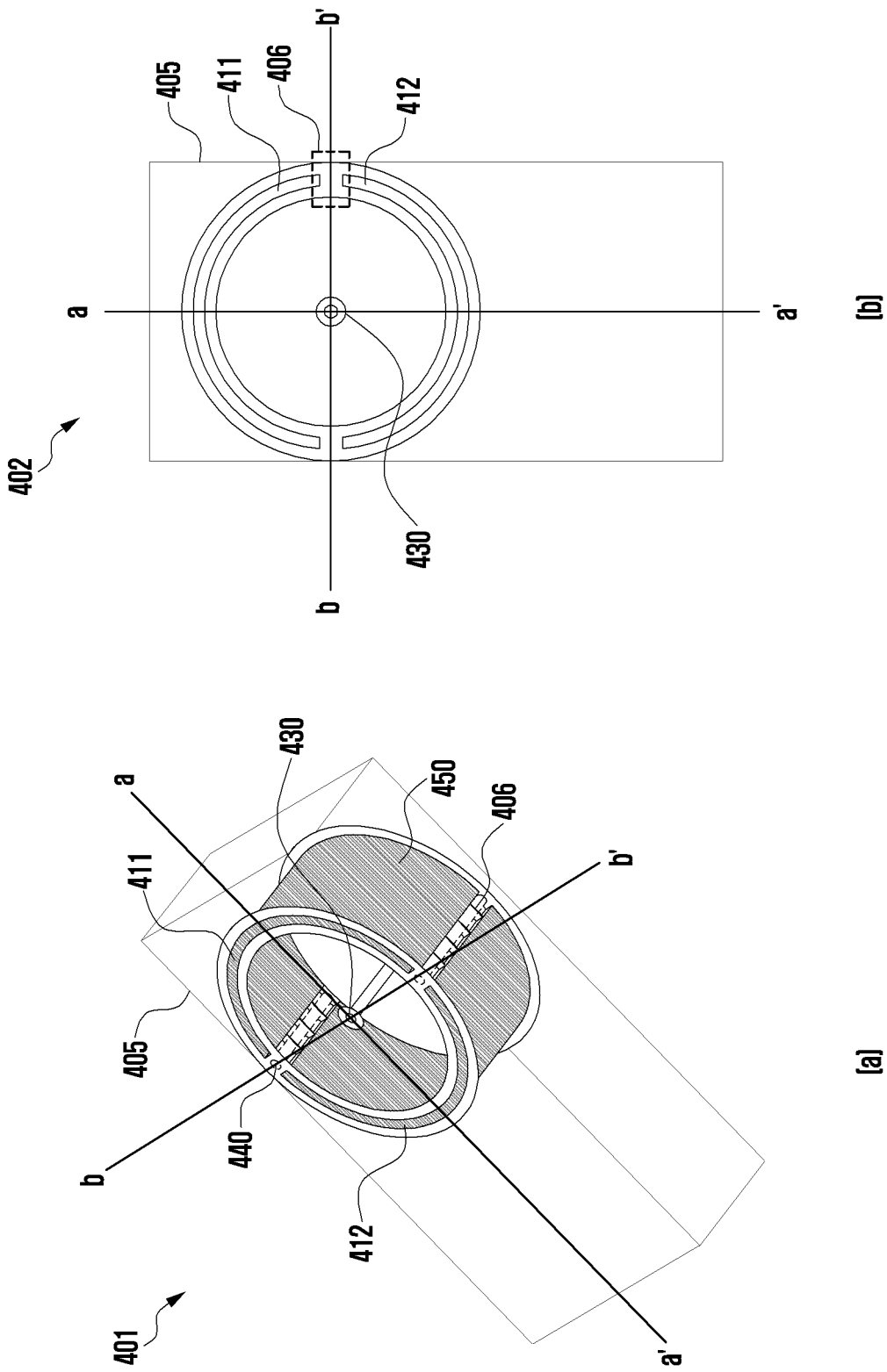
FIGS. 4A to 4C illustrate an interposer formed based on a printed circuit board according to various embodiments of the disclosure.
Figure 4B:
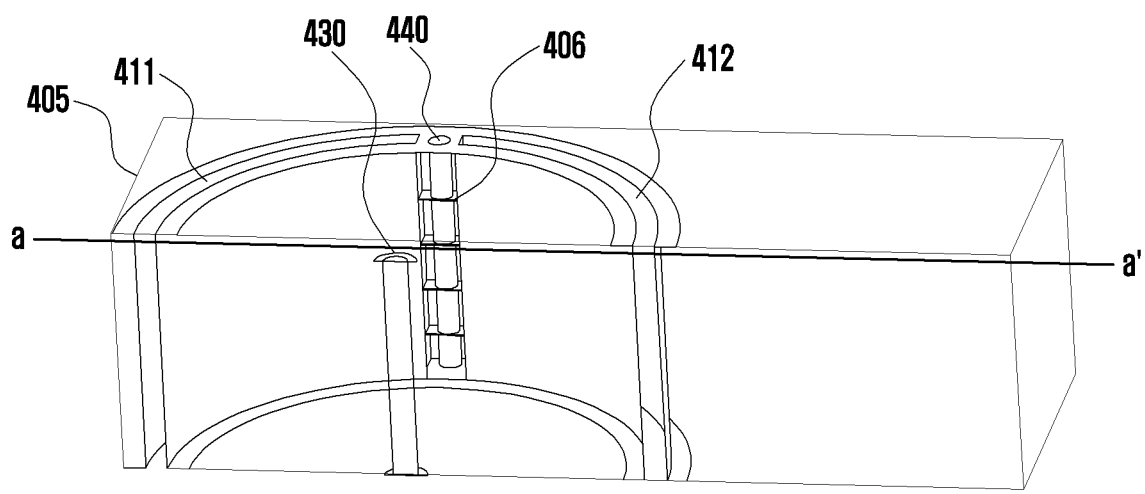
Figure 4B:
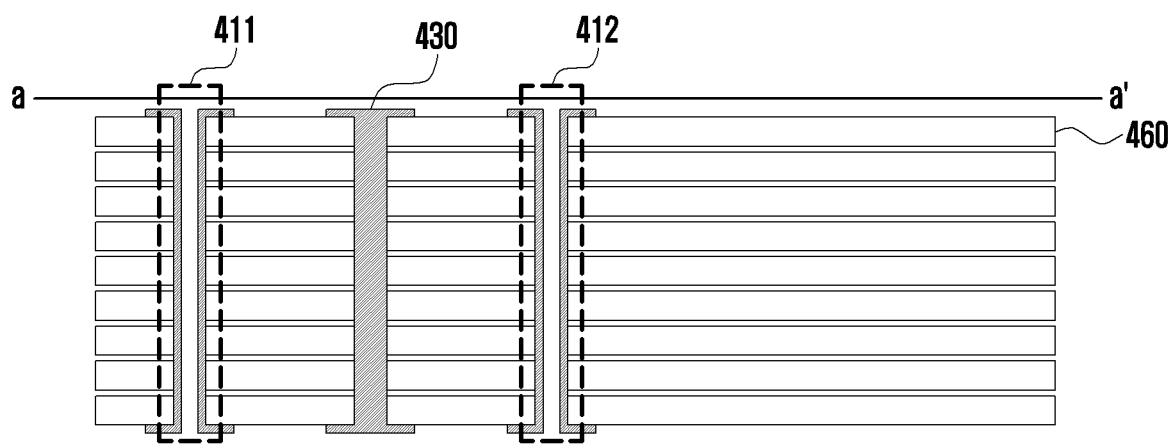
Figure 4C:
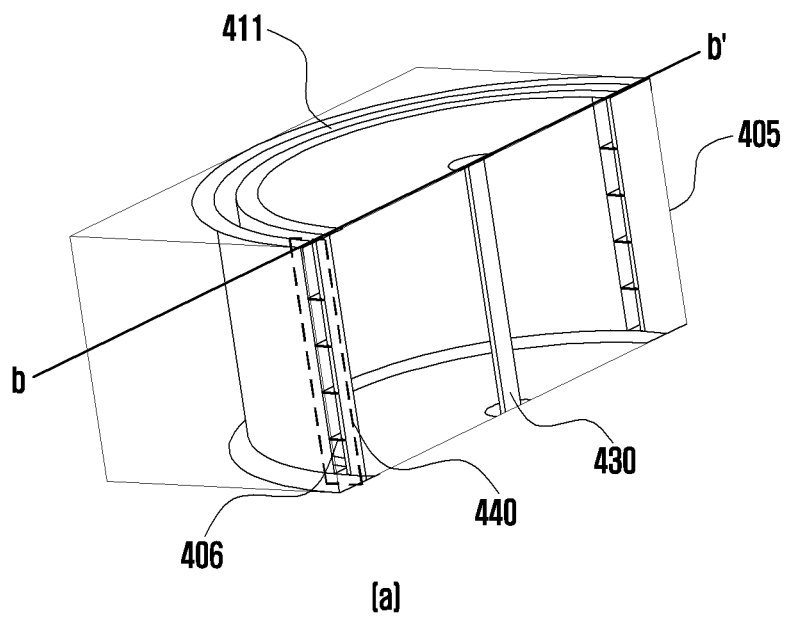
Figure 4C:
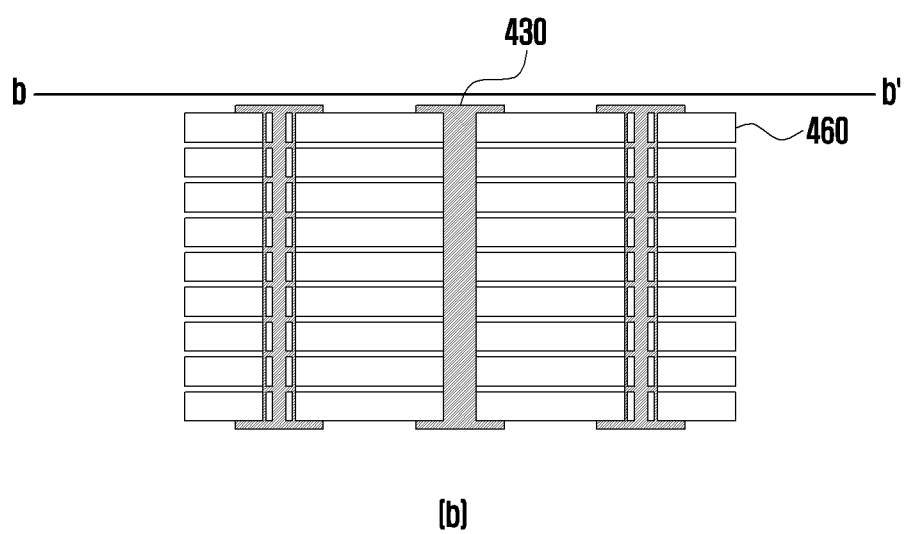

FIGS. 4A to 4C illustrate an interposer formed based on a printed circuit board according to various embodiments of the disclosure.

Part (a) of FIG. 4A illustrates an interposer 401 stereoscopically (in a three-dimensional form) according to various embodiments of the disclosure. The interposer 401 is a component formed between circuit boards as a via and a connection pad for signal connection, and may include a transmission path through which a signal is transmitted between a first circuit board and a second circuit board. For example, the interposer 401 may include a through-wire for connecting the first circuit board and the second circuit board through the via. According to an embodiment, the interposer 401 may include at least one component mounted thereon. The interposer 401 may be a substrate connection member for electrically connecting the first circuit board and the second circuit board. The interposer 401 may be electrical interface routing. According to an embodiment, the interposer 401 may be formed in a form in which one or more printed circuit boards (e.g., a printed circuit board (PCB), a printed board assembly (PBA), or a flexible printed circuit board (FPCB)) are stacked on each other. Part (b) of FIG. 4A is a plane view of the interposer 401 and may be a plane view of at least one printed circuit board.

Part (a) of FIG. 4A is a view 401 illustrating an interposer 405 according to various embodiments in three dimensions. The interposer 405 may include an opening part (e.g., a first semicircular long hole 411 and second semicircular long hole 412) extending through a front surface and a rear surface of the interposer 405. According to an embodiment, the interposer 405 may have a cylinder form through which the first semicircular long hole 411 and the second semicircular long hole 412 at least partially extend, and may include a dielectric body corresponding to each of the first semicircular long hole 411 and the second semicircular long hole 412. The interposer 405 may include at least one through-wire 430 (e.g., coaxial transmission line) which are coaxial corresponding to the first semicircular long hole 411 and the second semicircular long hole 412. The interposer 405 may include a surface mount device (SMD) pad corresponding to a region in which the through-wire 430 is formed, and the SMD pad may be at least partially soldered and attached to another printed circuit board.

According to an embodiment, at least one through-wire 430 may electrically connect a first printed circuit board disposed corresponding to a front surface of the interposer 405 to a second printed circuit board disposed corresponding to a rear surface of the interposer 405, and may be a transmission path through which a signal is transmitted between the first printed circuit board and the second printed circuit board.

According to an embodiment, an inner surface and an upper or lower surrounding part of each of the first semicircular long hole 411 and the second semicircular long hole 412 may be coated with a conductive member 450 (e.g., copper). The conductive member 450 on the inner surface may maintain to be coaxial to the through-wire 430 so as to form a coaxial line. The conductive member 450 on the upper or lower surrounding part may be connected to grounds (GNDs) of the first printed circuit board and the second printed circuit board through the SMD. A ground (GND) connection pad formed on the first printed circuit board and the second printed circuit board may be the same as or similar to the conductive member on the upper or lower surrounding part.

According to an embodiment, the interposer 405 may include the first semicircular long hole 411 and the second semicircular long hole 412, wherein each of the first semicircular long hole 411 and the second semicircular long hole 412 may be an opening part having a semicircular form. According to an embodiment, a bridge 406 may at least partially connect a conductive member coated on the first semicircular long hole 411 and a conductive member coated on the second semicircular long hole 412, and the bridge 406 may be a member constituting the interposer 405. According to an embodiment, the bridge 406 may partially connect an end of the first semicircular long hole 411 and an end of the second semicircular long hole 412, and may be a support member for physically supporting one or more printed circuit board layers constituting the interposer 405. According to an embodiment, the inner surface and the upper or lower surrounding part of each of the first semicircular long hole 411 and the second semicircular long hole 412 may be electrically connected by the conductive member 450. According to an embodiment, the bridge 406 may be at least partially coated with a conductive member.

Part (b) of FIG. 4A is a top view of the interposer 405 and illustrates one or more printed circuit board layers constituting the interposer 405. According to an embodiment, the interposer 405 has one or more printed circuit board layers stacked on each other, wherein the one or more printed circuit board layers may be manufactured to have an identical form and may be stacked, including different conductive patterns. The interposer 405 may include an opening part (e.g., the first semicircular long hole 411 and the second semicircular long hole 412) partially extending through a front surface and a rear surface (e.g., an upper part or a lower part). According to an embodiment, the interposer 405 may include the first semicircular long hole 411 and the second semicircular long hole 412, wherein each of the first semicircular long hole 411 and the second semicircular long hole 412 may be an opening part having a semicircular form. According to an embodiment, a bridge 406 may at least partially connect a conductive member coated on the first semicircular long hole 411 to a conductive member coated on the second semicircular long hole 412, and the bridge 406 may be a member constituting the interposer 405. According to an embodiment, the bridge 406 may partially connect an end of the first semicircular long hole 411 and an end of the second semicircular long hole 412. According to an embodiment, an inner surface and an upper or lower surrounding part of each of the first semicircular long hole 411 and the second semicircular long hole 412 may be electrically connected by a conductive member 450. According to an embodiment, the bridge 406 may be at least partially coated with a conductive member.

FIG. 4B is a sectional view of the interposer 405, taken along line a-a', and FIG. 4C is a sectional view of the interposer 405, taken along line b-b'.

Part (a) of FIG. 4B is a three-dimensional sectional view of the interposer 405, taken along line a-a' (e.g., line a-a' of FIG. 4A), and part (b) of FIG. 4B is a two-dimensional sectional view of the interposer 405, taken along line a-a'.

Referring to parts (a) and (b) of FIG. 4B, the interposer 405 may include a first semicircular long hole 411 and a second semicircular long hole 412. According to an embodiment, the interposer 405 may have one or more printed circuit board layers 460 stacked on each other. According to an embodiment, the number of the stacked printed circuit board layers 460 is not limited to a particular number.

Referring to part (b) of FIG. 4B, each of the first semicircular long hole 411 and the second semicircular long hole 412 may be an opening part having a form extending through a front surface and a rear surface of the interposer 405. The through-wire 430 may partially extend through from the front surface to the rear surface of the interposer 405, and may electrically connect a first terminal disposed on the front surface of the interposer 405 to a second terminal disposed on the rear surface of the interposer 405. For example, the interposer 405 may electrically connect, through the through-wire 430, a first terminal of a first printed circuit board, the first terminal being disposed on the front surface thereof, to a second terminal of a second printed circuit board, the second terminal being disposed on the rear surface thereof. According to an embodiment, an inner surface and an upper or lower surrounding part of the first semicircular long hole 411 or an inner surface and an upper or lower surrounding part of the second semicircular long hole 412 may be coated with a conductive member. The conductive member of the upper or lower surrounding part may function as a terminal connected to a ground (GND).

Part (a) of FIG. 4C is a three-dimensional sectional view of the interposer 405, taken along line b-b', and part (b) of FIG. 4C is a two-dimensional sectional view of the interposer 405, taken along line b-b'.

Parts (a) and (b) of FIG. 4C are sectional views illustrating a first semicircular long hole 411 of the interposer 405. The first semicircular long hole 411 may be an opening part having a form extending through from the front surface and the rear surface of the interposer 405.

Referring to FIGS. 4B and 4C, a conductive member coated on the first semicircular long hole 411 and a conductive member coated on the second semicircular long hole 412 may be electrically connected by means of a bridge 406. According to an embodiment, the interposer 405 may include, corresponding to a region having the bridge 406 formed therein, a via-hole 440 for connecting conductive patterns corresponding to grounds (GNDs) of layers. For example, the via-hole 440 may be partially formed in the region having the bridge 406 formed therein, and may be an opening part extending through from the front surface and the rear surface of the interposer 405. According to an embodiment, an inner surface of the via-hole 440 may be coated with a conductive member. According to an embodiment, the via-hole 440 may be a path through which a through-wire passes. According to an embodiment, the bridge 406 may partially connected an end of the first semicircular long hole 411 and an end of the second semicircular long hole 412, and may be a support member for physically supporting one or more printed circuit board layers constituting the interposer 405.

According to various embodiments, the interposer 405 may have at least one printed circuit board 460 stacked on each other. The interposer 405 may include an opening part (e.g., the first semicircular long hole 411 and the second semicircular long hole 412) extending through the front surface and the rear surface of the interposer 405. The at least one printed circuit board 460 may have multiple printed circuit boards stacked on each other such that a first semicircular long hole 411 and a second semicircular long hole 412 are formed therein. According to an embodiment, the interposer 405 may include at least one through-wire 430. The through-wire 430 may be a via (e.g., a via-hole). According to an embodiment, the interposer 405 may electrically connect, based on the at least one through-wire 430, a first terminal of a first printed circuit board, the first terminal being disposed on the front surface of the interposer 405, to a second terminal of a second printed circuit board, the second terminal being disposed on the rear surface of the interposer 405.

Figure 5:
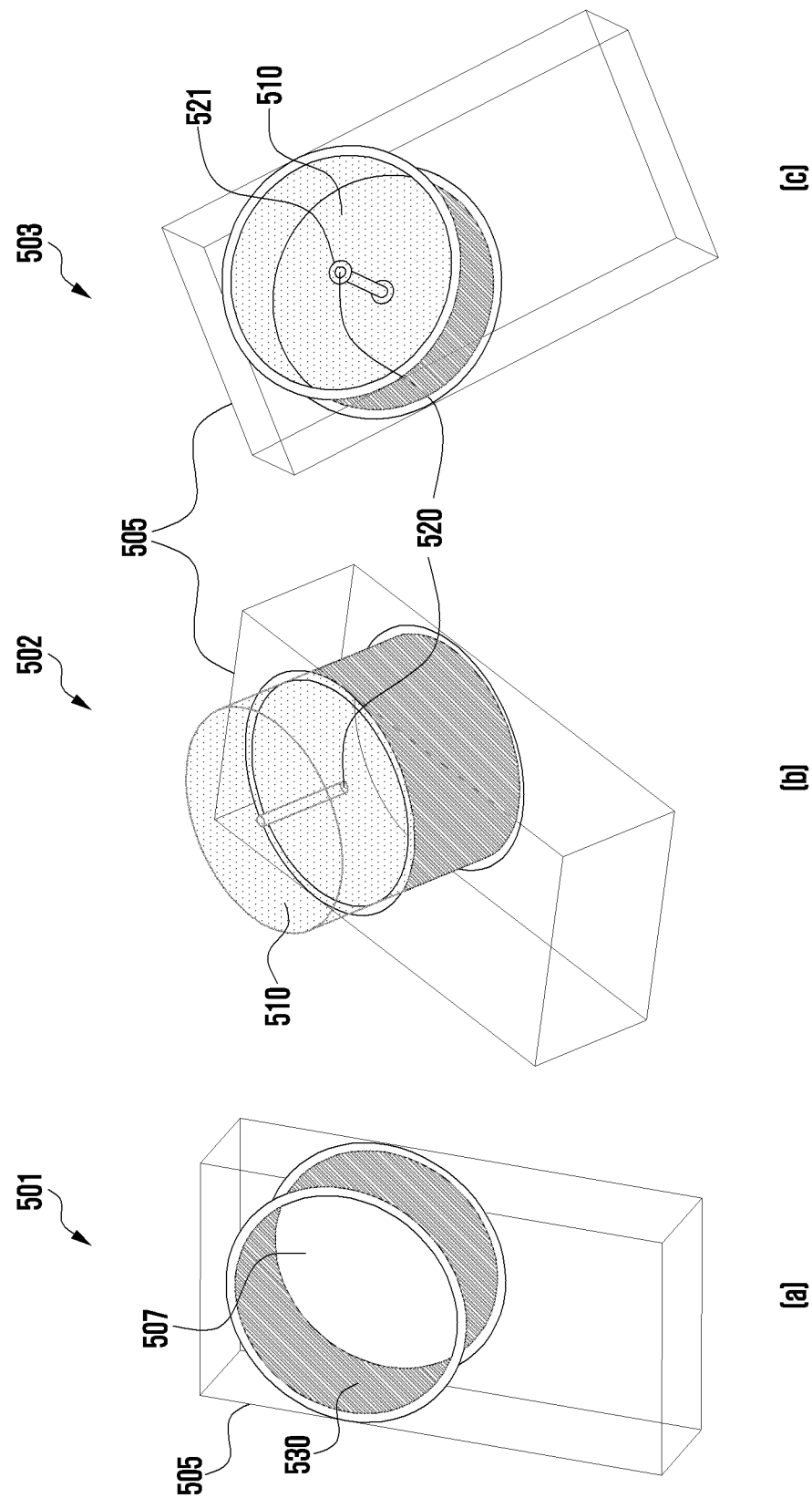
FIG. 5 illustrates an interposer which has a dielectric body filling a circular opening part according to various embodiments of the disclosure.

FIG. 5 illustrates an interposer 505 which has a dielectric body 510 filling a circular opening part according to various embodiments of the disclosure.

Part (a) of FIG. 5 is a view 501 illustrating the interposer 505 having one or more printed circuit board layers stacked on each other according to various embodiments of the disclosure. Part (b) of FIG. 5 is a view 502 illustrating a process of filling a dielectric body 510 in a circular opening part 507 of the interposer 505 according to various embodiments of the disclosure. Part (c) of FIG. 5 is a view 503 illustrating a situation in which the circular opening part 507 includes one or more through-wires and a conductive pin 520 extending through the interposer 505 is inserted by means of the through-wire.

Referring to part (a) of FIG. 5, the interposer 505 may have one or more printed circuit board layers stacked on each other. The interposer 505 may include at least one opening parts partially extending through the front surface and the rear surface thereof, and a conductive member 530 may be coated corresponding to an inner surface and an upper or lower surrounding part of the opening part.

Referring to part (b) of FIG. 5, the circular opening part 507 of the opening part of the interposer 505 may be filled with the dielectric body 510, and may include at least one conductive pin 520 extending through the dielectric body 510. According to an embodiment, the dielectric body 510 filling the circular opening part 507 may have a dielectric constant lower than that of a dielectric body used corresponding to a region other than the circular opening part 507. For example, when a signal is transmitted based on a conductive pattern disposed adjacent to a dielectric body, a smaller signal-loss can occur in the dielectric body 510 having a relatively lower dielectric constant in comparison with a dielectric body having a higher dielectric constant.

Referring to part (c) of FIG. 5, the conductive pin 520 may be inserted into the circular opening part 507 of the interposer 505. According to various embodiments, when a signal is transmitted through the conductive pin 520, an electronic device (e.g., the electronic device 101 of FIG. 1) can prevent reduction of the strength of the transmitted signal by means of the dielectric body 510 filling around the conductive pin 520. According to various embodiments, a signal passing through the conductive pin 520 can be effectively transmitted by means of the dielectric body 510 without any signal loss. The dielectric body 510 may further include a surface mount device (SMD) and a conductive pad 521 for transferring a signal. The conductive pad 521 may be electrically connected to the conductive pin 520.

Figure 6:
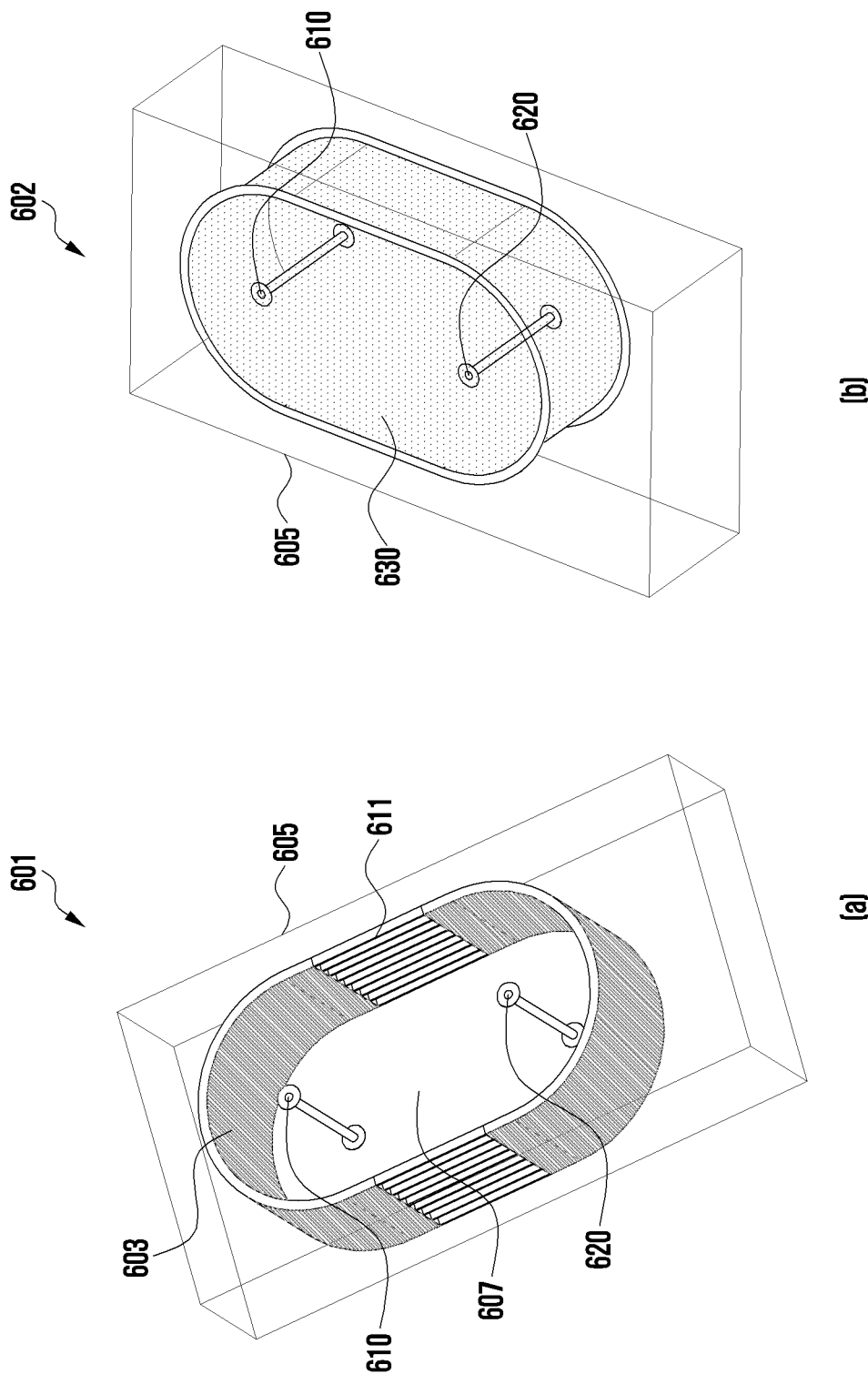
FIG. 6 illustrates an interposer in which one or more through-wires are included in a circular opening part according various embodiments of the disclosure.

FIG. 6 illustrates an interposer 605 in which one or more through-wires 610 and 620 are included in a circular opening part according various embodiments of the disclosure.

Part (a) of FIG. 6 is a view 601 illustrating an interposer 605 having one or more printed circuit boards stacked on each other according to various embodiments of the disclosure. Part (b) of FIG. 6 is a view 602 illustrating a state in which a circular opening part 607 (e.g., the circuit opening part 507 of FIG. 5) of the interposer 605 is filled with a dielectric body 630 according to various embodiments of the disclosure.

Referring part (a) of FIG. 6, the interposer 605 may include the circular opening part 607, and may include one or more through-wires 610 and 620 in the circular opening part 607. The one or more through-wires 610 and 620 may be vias. An inner surface of the circular opening part 607 may be coated with a conductive member 603. In the interposer 605 according to various embodiments, one or more printed circuit boards are electrically connected by means of the coated conductive member 603. The interposer 605 may have a support part 611 (e.g., the bridge 406 of FIG. 4A) formed corresponding to one side surface, and the support part 611 may be a support member for physically supporting one or more printed circuit board layers constituting the interposer 605. According to an embodiment, the interposer 605 may have at least one hole (e.g., a via-hole) at least partially extending through a region corresponding to the support part 611.

Referring to part (b) of FIG. 6, the circular opening part 607 of the interposer 605 may be filled with a dielectric body 630. The interposer 605 may include one or more conductive pins 610 and 620 (e.g., through-wires) surrounded by the dielectric body 630. According to an embodiment, the dielectric body 630 (e.g., a first dielectric body) filling the circular opening part 607 may have a dielectric constant lower than that of a dielectric body (e.g., a second dielectric body) used for a region other than the circular opening part 607. According to an embodiment, the first dielectric body may have a dielectric constant lower than that of the second dielectric body, and the lower the dielectric constant, a blocking rate by which an electromagnetic force generated from the outside is blocked becomes higher. According to an embodiment, the dielectric body 630 may further include an SMD and a conductive pad for signal transmission. The conductive pad may be electrically connected to the one or more conductive pins 610 and 620. According to an embodiment, when a signal is transmitted through the one or more conductive pins 610 and 620, the signal can be effectively transmitted by means of the dielectric body 630 without any power loss.

Figure 7:
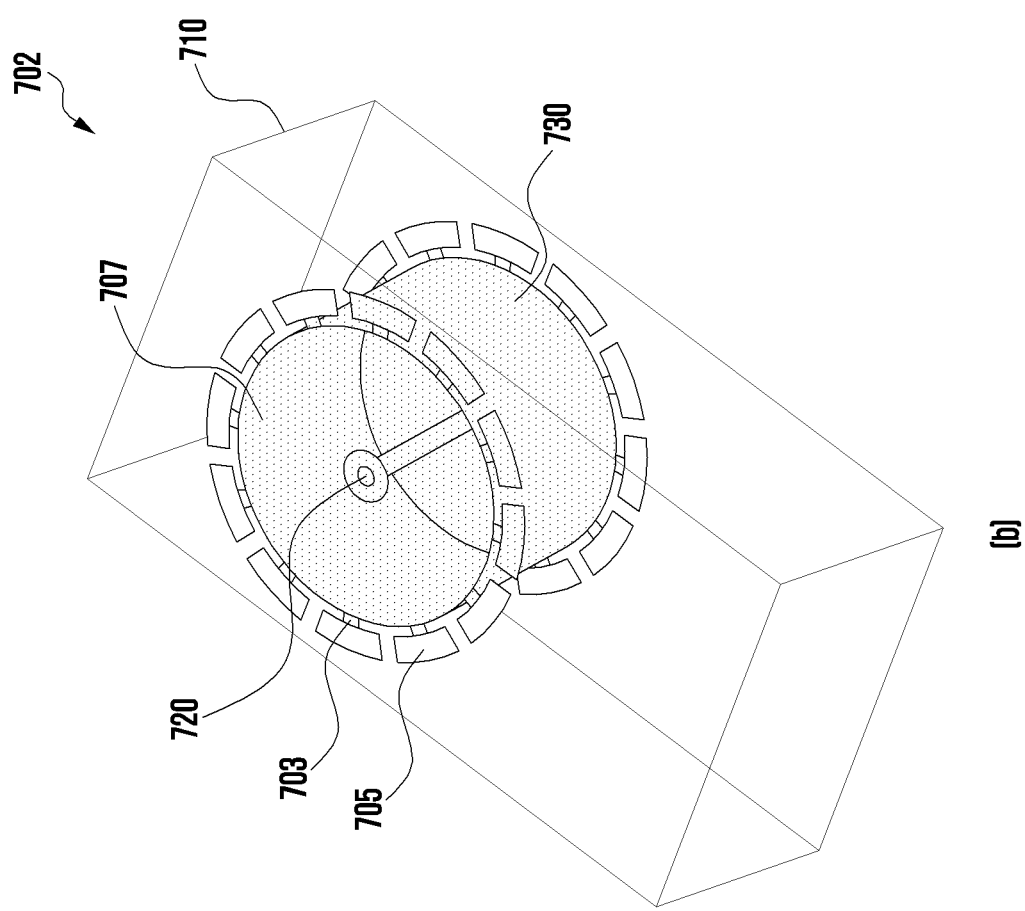
FIG. 7 illustrates an interposer including at least one pad so that a component is to be attached on a printed circuit board according various embodiments of the disclosure.
Figure 7:
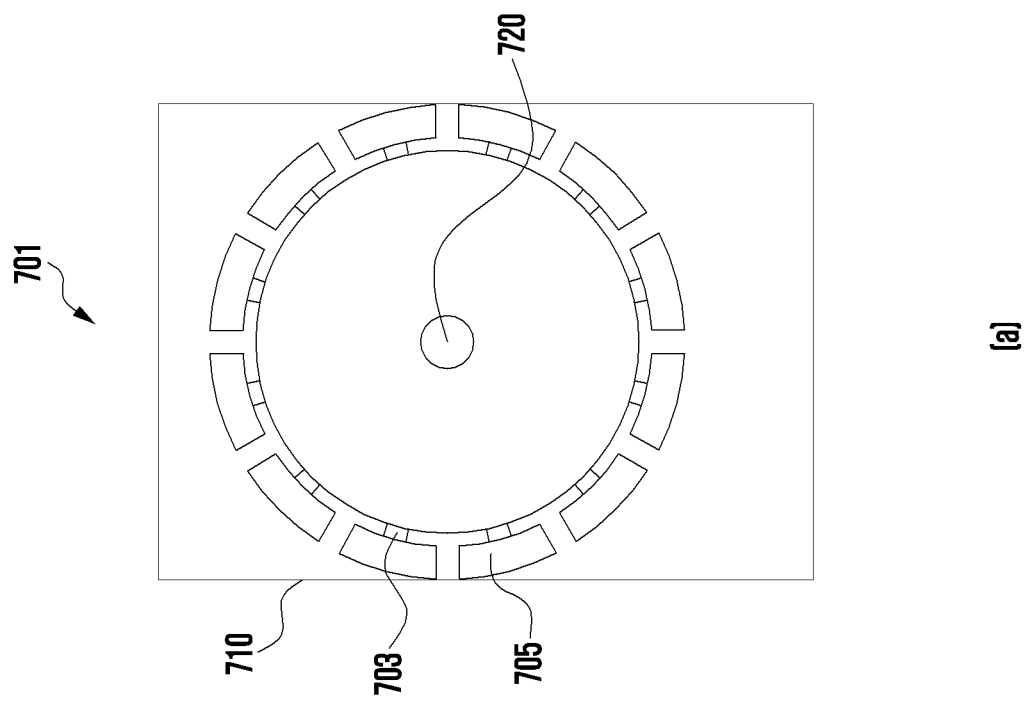

FIG. 7 illustrates an interposer 710 including at least one pad 705 (e.g., a thermally-conductive pad (a thermal pad), a thermal pad, and a conductive pad) so that a component is to be attached on a printed circuit board according to various embodiments of the disclosure.

Part (a) of FIG. 7 is a view 701 illustrating the interposer 710 to which at least one pad 705 is attached to one end thereof according to various embodiments of the disclosure. Part (b) of FIG. 7 is a view 702 illustrating the interposer 710 having one or more printed circuit boards stacked on each other according to various embodiments of the disclosure.

Referring to parts (a) and (b) of FIG. 7, according to various embodiments of the disclosure, the interposer 710 has one or more printed circuit boards stacked on each other, and may include at least one pad 705 (e.g., a thermally-conductive pad) corresponding to the front surface and the rear surface of the interposer 710. When a component (e.g., an element) is at least partially attached, the thermally-conductive pad 705 may allow the component to be attached corresponding to the front surface and the rear surface of the interposer 710. For example, in the process of attaching the component, the thermally-conductive pad 705 allows the lead to be easily melted.

The interposer 710 may be electrically connected to the at least one pad 705 by at least partially using a conductive member 703. The interposer 710 may include an opening part (e.g., a circular opening part (the circular opening part 507 of FIG. 5), and may include at least one through-wire 720 inside the opening part. An inner surface of the opening part may be coated with a conductive member 730. The opening part of the interposer 710 may be filled with a dielectric body 707. The dielectric body 707 filling the opening part may have a dielectric constant lower than that of a dielectric body used in a region other than the opening part. According to various embodiments, when a signal is transmitted through the at least one through-wire 720, the signal can be effectively transmitted by means of the dielectric body 707 filling around the through-wire 720, while minimizing power loss. According to an embodiment, the at least one through-wire 720 may be coated with a conductive member.

Figure 8:
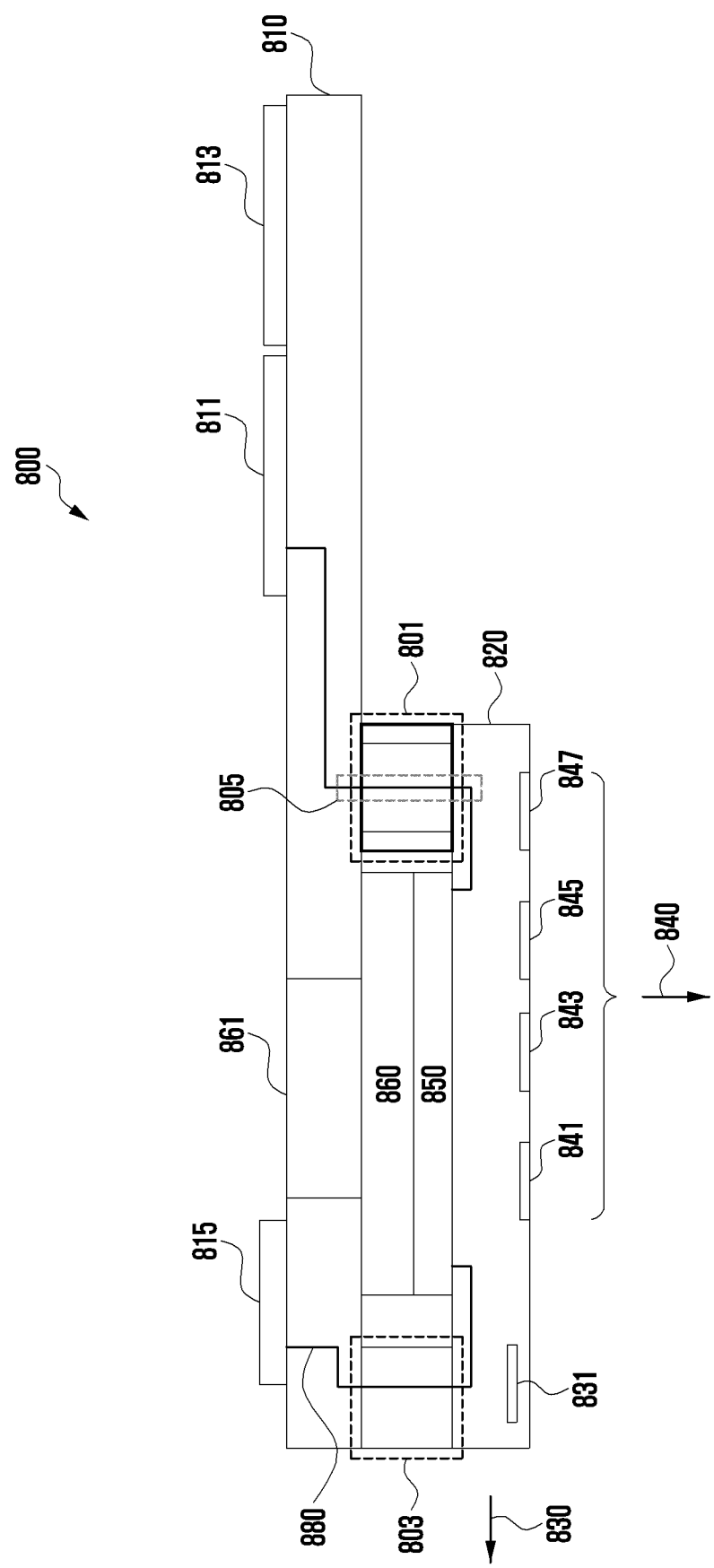
FIG. 8 illustrates an interposer disposed between stacked printed circuit boards according to various embodiments of the disclosure.

FIG. 8 illustrates an interposer 801 disposed between stacked printed circuit boards 810 and 820 according to various embodiments of the disclosure.

Referring to FIG. 8, an electronic device 800 (e.g., the electronic device 100 of FIG. 1) according to various embodiments may include a main printed circuit board (PCB) 810 and a radio frequency integrated circuit (RFIC) printed circuit board 820 (e.g., a wireless communication ultrahigh-frequency PCB).

The main printed circuit board 810 may include at least one control component (e.g., an intermediate frequency integrated circuit (IFIC) 811, a communication processor (CP) 813, or a power management integrated circuit (PMIC) 815) for operating the electronic device 800. According to various embodiments, the main printed circuit board 810 may further include a thermally-conductive compound (a thermal compound) 861 between the main printed circuit board 810 and the RFIC 850.

The RFIC printed circuit board 820 may include multiple antennas (e.g., first antennas 841, 843, 845, and 847 and a second antenna 831). For example, the first antennas 841, 843, 845, and 847 (e.g., an N*N (2D) antenna array and a 4*4 patch antenna array) may radiate a frequency signal corresponding to a first direction 840, and the second antenna 831 (e.g., an N (1D) antenna array and a 4-dipole antenna array) may radiate a frequency signal corresponding to a second direction 830.

Interposers 801 and 803 and an RFIC 850 may be arranged between the main printed circuit board 810 and the RFIC printed circuit board 820. According to an embodiment, a thermal interface material (TIM) 860 may be additionally disposed between the main printed circuit board 810 and the RFIC printed circuit board 820. The interposers 801 and 803 may include an opening part (e.g., the first semicircular long hole 411 and the second semicircular long hole 412 of FIG. 4A) partially extending through the front surface and the rear surface of each of the interposers 801 and 803. According to an embodiment, each of the interposers 801 and 803 may have a cylinder form through which a semicircular long hole at least partially extends, and may include a dielectric body corresponding to the semicircular long hole. According to an embodiment, the interposers 801 and 803 may include a through-wire 805 for transmitting a signal while being coaxial corresponding to the semicircular long hole.

The interposer 801 (e.g., a first interposer) according to various embodiments may include at least one through-wire 805 for electrically connecting the main printed circuit board 810 and the RFIC printed circuit board 820. The at least one through-wire 805 may be a via. For example, the IFIC 811 and the RFIC 850 may be electrically connected through the through-wire 805 having a coaxial line in the interposer 801 and may transmit or receive an intermediate frequency (IF) signal and a radio frequency (RF) signal.

According to various embodiments, each of an inner surface and an upper or lower surrounding part of a semicircular long hole (e.g., the first semicircular long hole 411 and the second semicircular long hole 412 of FIG. 4A) may be coated with a conductive member (e.g., copper). A conductive member of the inner surface may form a coaxial line while maintaining to be coaxial to the through-wire 805. A conductive member of the upper or lower surrounding part may be connected to grounds (GNDs) of the main printed circuit board 810 and the RFID printed circuit board 820 through the SMD. According to an embodiment, a ground connection pad formed on the main printed circuit board 810 and the RFIC printed circuit board 820 may be identical to or similar to a conductive member of the upper or lower surrounding part.

According to various embodiments, the interposer 801 may include the through-wire 805 partially extending through the front surface and the rear surface of the interposer 801. For example, the through-wire 805 may be a signal transmission path for electrically connecting the main printed circuit board 810 and the RFIC printed circuit board 820. According to an embodiment, the electronic device 800 may transmit or receive a signal between the main printed circuit board 810 and the RFIC printed circuit board 820 through the through-wire 805 included in the interposer 801.

According to various embodiments, the interposer 801 may be filled with a dielectric body corresponding to the inside of the semicircular long hole (e.g., the first semicircular long hole 411 and the second semicircular long hole 412 of FIG. 4A), and the through-wire 805 may extend through the dielectric body. According to an embodiment, as shown in FIG. 5 above, the dielectric body 510 filling inside of the circular opening part 507 may have a dielectric constant lower than that of a dielectric body filling the outside the circular opening part 507. A signal (e.g., an IF signal) passing through the through-wire 805 can be effectively transmitted while preventing the reduction of the strength of the signal, by means of a dielectric body having a lower dielectric constant. According to various embodiments, a control line controlled by the IFIC 811 and the CP 813 may be connected to the RFIC 850 by means of the through-wire 805 of the interposer 801.

According to various embodiments, the electronic device 800 may additionally include another interposer 803 (e.g., a second interposer), and the PMIC 815 and the RFIC 850 may be electrically connected to each other by means of a power line 880. The power line 880 may be electrically connected to the PMIC 815 and the RFIC 850 through a through-wire that is formed through the interposer 803.

According to various embodiments, the IFIC 811 and the CP 813 may be integrally manufactured. According to an embodiment, a thermal interface material (TIM) 860 may have a form including a thermally-conductive compound 861, and may be at least partially included in the main printed circuit board 810. The TIM 860 may have various forms corresponding to one or more printed circuit boards.

Figure 9:
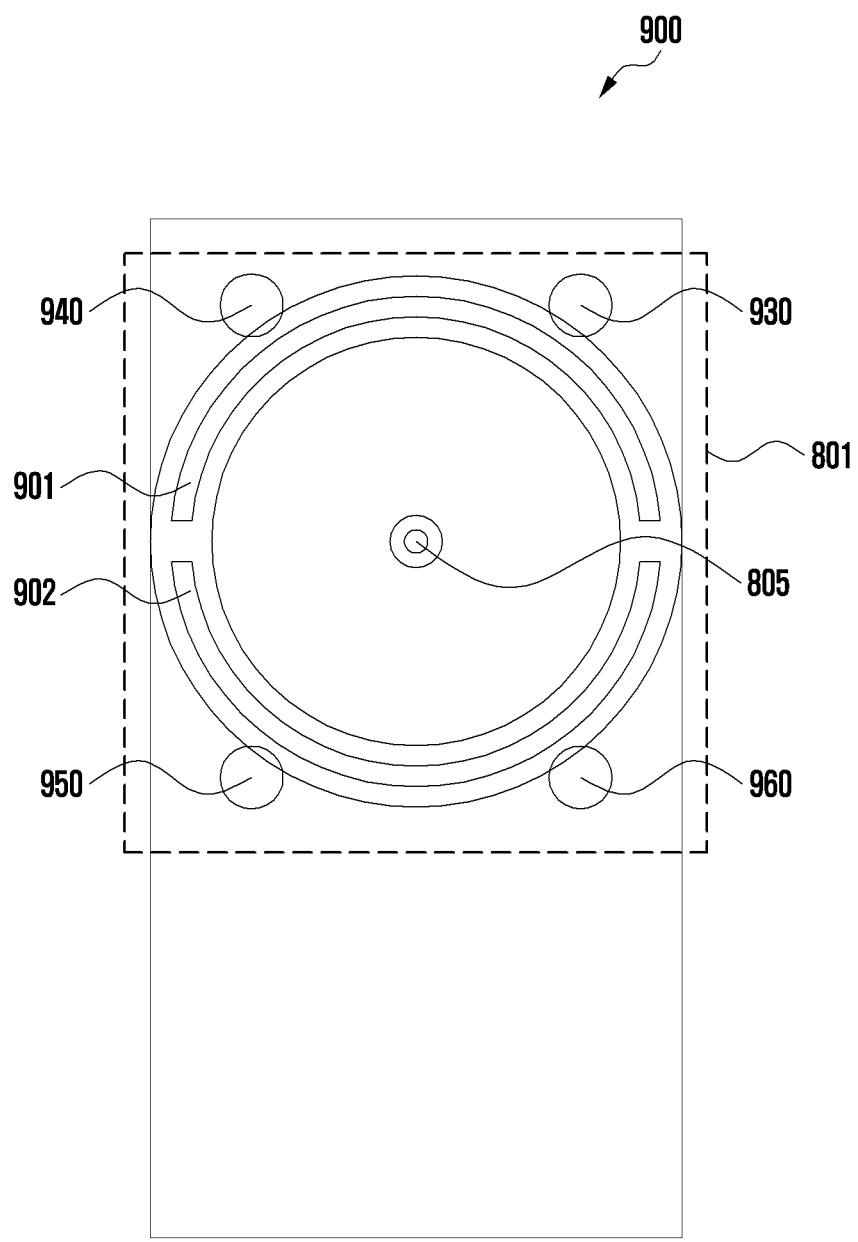
FIG. 9 is a view illustrating an embodiment in which an additional circular pad is disposed on an interposer according to various embodiments of the disclosure.

FIG. 9 is a view 900 illustrating an embodiment in which an additional circular pad is disposed on an interposer according to various embodiments of the disclosure.

According to various embodiments, an interposer 801 (e.g., the interposer 801 or 803 of FIG. 8) may be disposed between a main printed circuit board (e.g., the main printed circuit board 810 of FIG. 8) and an RFIC printed circuit board (e.g., the RFIC printed circuit board 820 of FIG. 8), and the interposer 801 may include one or more pads (e.g., 930, 940, 950, and 960) having via-holes formed therethrough.

FIG. 9 is a sectional view illustrating at least one printed circuit board having the interposer 801 formed thereon. According to various embodiments, the interposer 801 may include a first semicircular long hole 901 and a second semicircular long hole 902, each of which extends through the front surface and the rear surface of the interposer 801. According to an embodiment, the interposer 801 may have a cylinder form through which the first semicircular long hole 901 and the second semicircular long hole 902 at least partially extend through, and a dielectric body may be included corresponding to the first semicircular long hole 901 and the second semicircular long hole 902. According to an embodiment, a through-wire 805 for transmitting a signal may be included in each of the first semicircular long hole 901 and the second semicircular long hole 902.

According to various embodiments, the interposer 801 may include one or more pads 930, 940, 950, and 960, and via-holes may be formed corresponding to the pads 930, 940, 950, and 960. According to an embodiment, each of the pads 930, 940, 950, and 960 are not limited to a particular form and may be a member for reinforcing the adhesive strength with respect to a main printed circuit board (e.g., the main printed circuit board 810 of FIG. 8) and an RFIC printed circuit board (e.g., the RFIC printed circuit board 820 of FIG. 8). According to various embodiments, one or more via-holes formed based on the circular pads 930, 940, 950, and 960 may be bonded to the main printed circuit board 810 and the RFIC printed circuit board 820. For example, the interposer 801 may be bonded to the main printed circuit board 810 corresponding to one surface of a via-hole, and may be bonded to the RFIC printed circuit board 820 corresponding to the other surface of the via-hole by means of a low-temperature solder scheme.

A substrate connection member (e.g., the interposer 401 of FIG. 4A) according to various embodiments may have multiple layers stacked on each other and may include a printed circuit board (e.g., the printed circuit board layer 460 of FIGS. 4B and 4C) including a front surface, a rear surface, and a side surface encompassing the front surface and the rear surface. The printed circuit board 460 may include: at least one opening part (e.g., the first semicircular long hole 411 and the second semicircular long hole 412 of FIG. 4A) which encompasses a partial region of the printed circuit board and extends through from the front surface to the rear surface; at least one bridge (e.g., the bridge 406 of FIG. 4A) which is connected between the partial region and the printed circuit board and across at least a part of the opening part, and at least one through-wire (e.g., the through-wire 430 of FIG. 4A) formed in the partial region from the front surface to the rear surface, wherein an inner surface of the opening part and a side surface of the bridge 406 is formed of a conductive member.

According to various embodiments, the bridge 406 may have a conductive layer formed on at least a part of the multiple layers, and the conductive layer may be electrically connected to the conductive member.

According to various embodiments, the partial region may include a first dielectric body having a first dielectric constant, and a region other than the partial region may include a second dielectric body having a second dielectric constant lower than the first dielectric constant.

According to various embodiments, the conductive member may be electrically connected to a ground (GND) of the printed circuit board.

According to various embodiments, the at least one through-wire 430 may electrically connect a printed circuit board corresponding to the front surface and a printed circuit board corresponding to the rear surface.

According to various embodiments, the printed circuit board may further include at least one hole formed from the front surface to the rear surface corresponding to the at least one bridge 406.

According to various embodiments, the printed circuit board may further include at least one thermally-conductive member corresponding to at least one of the front surface and the rear surface, wherein the conductive member is electrically connected to the thermally-conductive member.

According to various embodiments, the printed circuit board may further include at least one circular member for reinforcing physical coupling between the multiple layers, and have at least one hole formed corresponding to the at least one circular member.

An electronic device (e.g., the electronic device 100 of FIG. 1) according to various embodiments may include a communication circuit and a printed circuit board (e.g., the printed circuit board layer 460 of FIGS. 4B and 4C) having multiple layers stacked on each other and including a front surface, a rear surface, and a side surface encompassing the front surface and the rear surface. The printed circuit board 460 may include: at least one opening part (e.g., the first semicircular long hole 411 and the second semicircular long hole 412 of FIG. 4A) which encompasses a partial region of the printed circuit board and extends through from the front surface to the rear surface; at least one bridge (e.g., the bridge 406 of FIG. 4A) connected between the partial region and the printed circuit board and across at least a part of the opening part; and at least one through-wire (e.g., the through-wire 430 of FIG. 4A) which is electrically connected to the communication circuit and is formed in the partial region from the front surface to the rear surface. In the printed circuit board 460, an inner surface of the opening part and a side surface of the bridge 406 may be formed of a conductive member.

According to various embodiments, the bridge 406 may have a conductive layer formed on at least a part of the multiple layers, and the conductive layer may be electrically connected to the conductive member.

According to various embodiments, the partial region of the printed circuit board may include a first dielectric body having a first dielectric constant, and a region other than the partial region may include a second dielectric body having a second dielectric constant lower than the first dielectric constant.

According to various embodiments, the conductive member may be electrically connected to a ground (GND) of the printed circuit board.

According to various embodiments, the at least one through-wire 430 may electrically connect a printed circuit board corresponding to the front surface and a printed circuit board corresponding to the rear surface.

According to various embodiments, the printed circuit board may further include at least one hole formed from the front surface to the rear surface corresponding to the at least one bridge 406.

According to various embodiments, the printed circuit board may further include at least one thermally-conductive member corresponding to at least one of the front surface and the rear surface, wherein the conductive member is electrically connected to the thermally-conductive member.

According to various embodiments, the printed circuit board may further include at least one circular member for reinforcing physical coupling between the multiple layers, and have at least one hole formed corresponding to the at least one circular member.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

The invention claimed is:

1. A substrate connection member comprising:
a printed circuit board (PCB) with multiple layers stacked on each other, the PCB including a front surface and a rear surface,
wherein the PCB comprises:
a first opening extending from the front surface to the rear surface, the first opening comprising a first conductive member coated on an inner surface of the first opening;
a second opening extending from the front surface to the rear surface, the second opening comprising a second conductive member coated on an inner surface of the second opening, the first opening and the second opening encompassing a partial region of the PCB;
a first conductive bridge connecting the first conductive member with the second conductive member based on a first end of the first opening and a first end of the second opening;
a second conductive bridge connecting the first conductive member with the second conductive member based on a second end of the first opening and a second end of the second opening; and
at least one through-wire extending from the front surface to the rear surface in the partial region,
wherein the first opening and the second opening are separated from one another,
wherein the first conductive bridge and the second conductive bridge are entirely disposed between the first opening and the second opening in an inner space between the front surface and the rear surface of the PCB, and
wherein the first conductive bridge and the second conductive bridge are disposed in the same layer among the multiple layers of the PCB.

2. The substrate connection member of claim 1, wherein the first conductive bridge and the second conductive bridge include a conductive layer formed on at least a part of the multiple layers, and the conductive layer is electrically connected to at least one of the first conductive member and the second conductive member,
wherein the substrate connection member is formed as a hollow cylinder, and the first opening defines a first semi-circular hollow in a first portion of a wall of the hollow cylinder, and the second opening defines a second semi-circular hollow in a second portion of the wall of the hollow cylinder, and
wherein the first conductive bridge and the second conductive bridge substantially span a height of the wall of the hollow cylinder.

3. The substrate connection member of claim 1, wherein the partial region of the PCB comprises a first dielectric body having a first dielectric constant, and a region other than the partial region comprises a second dielectric body having a second dielectric constant lower than the first dielectric constant.

4. The substrate connection member of claim 1, wherein at least one of the first conductive member and second conductive member is electrically connected to a ground (GND) of the PCB.

5. The substrate connection member of claim 1, wherein the at least one through-wire electrically connects a printed circuit board corresponding to the front surface and a printed circuit board corresponding to the rear surface.

6. The substrate connection member of claim 1, wherein the PCB further comprises at least one hole formed from the front surface to the rear surface corresponding to the at least one conductive bridge.

7. The substrate connection member of claim 1, wherein the PCB further comprises at least one thermally-conductive member corresponding to at least one of the front surface and the rear surface,
wherein at least one of the first conductive member and second conductive member is electrically connected to the thermally-conductive member.

8. The substrate connection member of claim 1, wherein the PCB further comprises at least one circular member configured to reinforce physical coupling between the multiple layers,
wherein at least one hole is formed corresponding to the at least one circular member.

9. An electronic device, comprising:
a first circuit board on which a first communication circuit is disposed;
a second circuit board on which a second communication circuit is disposed; and
a substrate connection member with multiple layers stacked on each other, the substrate connection member including a front surface corresponding to the first circuit board and a rear surface corresponding to the second circuit board,
wherein the substrate connection member comprises:
a first opening extending from the front surface to the rear surface, the first opening comprising a first conductive member coated on an inner surface of the first opening;
a second opening extending from the front surface to the rear surface, the second opening comprising a second conductive member coated on an inner surface of the second opening, the first opening and the second opening encompassing a partial region of the substrate connection member;
a first conductive bridge connecting the first conductive member with the second conductive member based on a first end of the first opening and a first end of the second opening;
a second conductive bridge connecting the first conductive member with the second conductive member based on a second end of the first opening and a second end of the second opening; and
at least one through-wire extending from the front surface to the rear surface in the partial region,
wherein the first opening and the second opening are separate from one another,
wherein the first communication circuit and the second communication circuit are electrically connected to each other through the at least one through-wire,
wherein the first conductive bridge and the second conductive bridge are entirely disposed between the first opening and the second opening in an inner space between the front surface and the rear surface of the PCB, and
wherein the first conductive bridge and the second conductive bridge are disposed in the same layer among the multiple layers of the PCB.

10. The electronic device of claim 9, wherein the first conductive bridge and the second conductive bridge include a conductive layer formed on at least a part of the multiple layers, and the conductive layer is electrically connected to at least one of the first conductive member and the second conductive member, and wherein the substrate connection member is formed as a hollow cylinder, and the first opening defines a first semi-circular hollow in a first portion of a wall of the hollow cylinder, and the second opening defines a second semi-circular hollow in a second portion of the wall of the hollow cylinder, and wherein the first conductive bridge and the second conductive bridge substantially span a height of the wall of the hollow cylinder.

11. The electronic device of claim 9, wherein the partial region of the substrate connection member comprises a first dielectric body having a first dielectric constant, and a region other than the partial region comprises a second dielectric body having a second dielectric constant lower than the first dielectric constant.

12. The electronic device of claim 9, wherein the at least one through-wire electrically connects a printed circuit board corresponding to the front surface and a printed circuit board corresponding to the rear surface.

13. The electronic device of claim 9, wherein the substrate connection member further comprises at least one hole formed from the front surface to the rear surface corresponding to the at least one conductive bridge.

14. The electronic device of claim 9, wherein the substrate connection member further comprises at least one thermally-conductive member corresponding to at least one of the front surface and the rear surface, wherein at least one of the first conductive member and the second conductive members is electrically connected to the thermally-conductive member.

15. The electronic device of claim 9, wherein the substrate connection member further comprises at least one circular member configured to reinforce physical coupling between the multiple layers, wherein at least one hole is formed corresponding to the at least one circular member.

* * * * *